United States Patent
Jeon et al.

(10) Patent No.: US 9,337,495 B2
(45) Date of Patent: May 10, 2016

(54) STAINLESS SEPARATOR FOR FUEL CELL AND METHOD OF MANUFACTURING THE SAME

(71) Applicant: HYUNDAI HYSCO CO., LTD., Ulsan (KR)

(72) Inventors: Yoo Taek Jeon, Yongin (KR); Kyeong Woo Chung, Seoul (KR)

(73) Assignee: HYUNDAI STEEL COMPANY, Incheon Metropolitan (KR)

( * ) Notice: Subject to any disclaimer, the term of this patent is extended or adjusted under 35 U.S.C. 154(b) by 0 days.

(21) Appl. No.: 14/471,960

(22) Filed: Aug. 28, 2014

(65) Prior Publication Data

US 2014/0370415 A1 Dec. 18, 2014

Related U.S. Application Data

(63) Continuation of application No. 12/426,150, filed on Apr. 17, 2009, now Pat. No. 9,070,907.

(30) Foreign Application Priority Data

Apr. 23, 2008 (KR) .................. 10-2008-0037916
May 6, 2008 (KR) .................. 10-2008-0041799

(51) Int. Cl.
*H01M 8/02* (2006.01)
*C23C 22/46* (2006.01)
(Continued)

(52) U.S. Cl.
CPC .............. *H01M 8/021* (2013.01); *C21D 9/0068* (2013.01); *C23C 8/04* (2013.01); *C23C 8/08* (2013.01);
(Continued)

(58) Field of Classification Search
None
See application file for complete search history.

(56) References Cited

U.S. PATENT DOCUMENTS

| | | | |
|---|---|---|---|
| 6,440,598 B1 | 8/2002 | Fukui et al. | |
| 2010/0129697 A1* | 5/2010 | Jeon et al. | ............. C22C 38/008 429/514 |
| 2011/0065024 A1* | 3/2011 | Jeon et al. | ........... H01M 8/0206 429/514 |

FOREIGN PATENT DOCUMENTS

| | | |
|---|---|---|
| JP | 11162478 A | 6/1999 |
| JP | 2002270196 A | 9/2002 |

(Continued)

OTHER PUBLICATIONS

Japanese Notice of Allowance dated Mar. 7, 2014.
(Continued)

*Primary Examiner* — Sarah A Slifka
(74) *Attorney, Agent, or Firm* — Hauptman Ham, LLP

(57) ABSTRACT

A stainless steel separator for fuel cells and a method of manufacturing the same are disclosed. The method includes preparing a stainless steel sheet as a matrix, performing surface modification on a surface of the stainless steel sheet to form a Cr-rich passive film having a comparatively increased amount of Cr in a superficial layer of the stainless steel sheet by decreasing an amount of Fe in the superficial layer of the stainless steel sheet, and forming a coating layer on the surface of the surface-modified stainless steel sheet. The coating layer is one selected from a metal nitride layer ($MN_x$), a metal/metal nitride layer ($M/MN_x$), a metal carbide layer ($MC_y$), and a metal boride layer ($MB_z$) (where $0.5 \leq x \leq 1$, $0.42 \leq y \leq 1$, $0.5 \leq z \leq 2$).

11 Claims, 12 Drawing Sheets

(51) Int. Cl.
- *C23C 22/50* (2006.01)
- *C23G 1/08* (2006.01)
- *C25D 11/34* (2006.01)
- *C21D 9/00* (2006.01)
- *C23C 8/04* (2006.01)
- *C23C 8/08* (2006.01)
- *C23C 8/22* (2006.01)
- *C23C 8/26* (2006.01)
- *C23C 14/00* (2006.01)
- *C23C 14/48* (2006.01)
- *H01M 8/10* (2016.01)

(52) U.S. Cl.
CPC ... *C23C 8/22* (2013.01); *C23C 8/26* (2013.01); *C23C 14/0036* (2013.01); *C23C 14/48* (2013.01); *C23C 22/46* (2013.01); *C23C 22/50* (2013.01); *C23G 1/085* (2013.01); *C23G 1/088* (2013.01); *C25D 11/34* (2013.01); *H01M 8/0228* (2013.01); *H01M 2008/1095* (2013.01); *Y02E 60/50* (2013.01); *Y02P 70/56* (2015.11)

(56) References Cited

FOREIGN PATENT DOCUMENTS

| | | | |
|---|---|---|---|
| JP | 2003123783 A | 4/2003 | |
| JP | 2003223902 A | 8/2003 | |
| JP | 2007234244 A | 9/2007 | |
| JP | 2008091225 A | 4/2008 | |
| JP | 5222214 B2 | 6/2013 | |
| KR | 777123 | * | 11/2007 |
| KR | 791274 | * | 4/2008 |

OTHER PUBLICATIONS

Japanese Office Action dated Nov. 22, 2013.
United States Final Office Action dated Jan. 29, 2016 in connection with the counterpart U.S. Appl. No. 14/700,676, citing the above reference(s).

* cited by examiner

STAINLESS SEPARATOR FOR FUEL CELL AND METHOD OF MANUFACTURING THE SAME

CROSS REFERENCE TO RELATED APPLICATION

The present application is a Continuation Application of U.S. application Ser. No. 12/426,150, filed on Apr. 17, 2009, which is a Non-provisional application claims the priorities of Korean Patent Application No. 10-2008-0037916, filed on Apr. 23, 2008 and No. 10-2008-0041799, filed on May 6, 2008 in the KIPO (Korean Intellectual Property Office), the disclosure of which are incorporated herein in their entirety by reference.

BACKGROUND OF THE INVENTION

1. Field of the Invention

The present invention relates to a stainless steel separator for fuel cells and a method of manufacturing the same. More particularly, the present invention relates to a stainless steel separator for fuel cells and a method of manufacturing the same, which is used for polymer electrolyte fuel cells (PEM-FCs) and exhibits superior corrosion resistance, electrical conductivity, and durability.

2. Description of the Related Art

Since a unit cell of a fuel cell stack generates too low a voltage to be used alone in practice, the fuel cell stack generally includes several to several hundred unit cells stacked therein. When stacking the unit cells, a separator or bipolar plate is used to facilitate electrical connection between the unit cells while separating a reaction gas.

The bipolar plate is an essential component of the fuel cell along with a membrane electrode assembly (MEA) and has a variety of functions, such as structural support for the MEA and gas diffusion layers (GDLs), collection and transfer of current, transmission and removal of reaction gas, transmission of water coolant for removing reaction heat, etc.

Hence, it is necessary for materials of the bipolar plate to have excellent electrical and thermal conductivity, air-tightness, chemical stability, and the like.

Graphite-based materials and composite graphite materials composed of resin and graphite are employed as the materials for the bipolar plate.

However, the graphite-based material has lower strength and air-tightness than metallic materials, and demands high manufacturing costs irrespective of low productivity when applied to the bipolar plate. Recently, metallic bipolar plates have been actively investigated to overcome such problems of the graphite bipolar plate.

When the bipolar plate is made of a metallic material, there are many merits in that volume and weight reduction of a fuel cell stack can be accomplished via thickness reduction of the bipolar plate, and in that the bipolar plate can be fabricated by stamping and the like, thereby ensuring mass production of the bipolar plates.

However, the metallic material inevitably undergoes corrosion during use of the fuel cell, causing contamination of the MEA and performance deterioration of the fuel cell stack. Further, a thick oxide film can be grown on the metal surface after extended use of the fuel cell, thereby causing an increase in internal resistance of the fuel cell.

Stainless steel, titanium alloys, aluminum alloys, nickel alloys, and the like are proposed as candidate materials for the bipolar plate of the fuel cell. Particularly, stainless steel has received attention due to its low price and good corrosion resistance, but further improvements in corrosion resistance and electrical conductivity are still needed.

SUMMARY OF THE INVENTION

The present invention is conceived to solve the problems of the related art as described above, and an aspect of the present invention is to provide a method of manufacturing a stainless steel separator for fuel cells that has corrosion resistance and contact resistance satisfying the standards of the Department of Energy (DOE) not only at an initial stage but also after exposure to high temperature-high humidity conditions in the fuel cell for a long duration.

Another aspect of the present invention is to provide a stainless steel separator manufactured by the method.

According to one embodiment of the present invention, a method of manufacturing a stainless steel separator for fuel cells includes: preparing a stainless steel sheet as a matrix; performing surface modification on a surface of the stainless steel sheet to form a Cr-rich passive film having a comparatively increased amount of Cr in a superficial layer of the stainless steel sheet by decreasing an amount of Fe in the superficial layer of the stainless steel sheet; and forming a coating layer on the surface of the surface-modified stainless steel sheet, the coating layer being one selected from a metal nitride layer ($MN_x$), a metal/metal nitride layer ($M/MN_x$), a metal carbide layer ($MC_y$), and a metal boride layer ($MB_z$) (where $0.5 \leq x \leq 1$, $0.42 \leq y \leq 1$, $0.5 \leq z \leq 2$).

According to another embodiment of the present invention, a method of manufacturing a stainless steel separator for fuel cells includes: preparing a stainless steel sheet as a matrix; performing surface modification on a surface of the stainless steel sheet to form a Cr-rich passive film having a comparatively increased amount of Cr in a superficial layer of the stainless steel sheet by decreasing an amount of Fe in the superficial layer of the stainless steel sheet; and heat-treating the surface-modified stainless steel sheet at 100~300° C. under vacuum, in air or in an inert gas atmosphere.

BRIEF DESCRIPTION OF THE DRAWINGS

The above and other aspects, features and advantages of the present invention will become apparent from the following description of exemplary embodiments given in conjunction with the accompanying drawings, in which.

DETAILED DESCRIPTION OF THE EMBODIMENT

Figure 1:
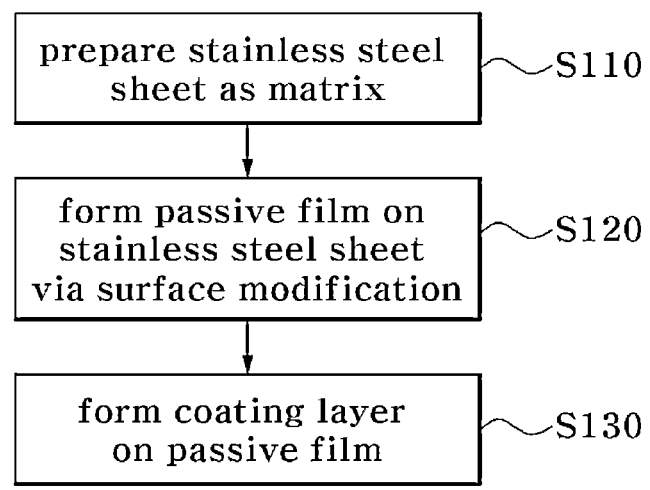
FIG. 1 is a flowchart of a method of manufacturing a stainless steel separator according to one embodiment of the present invention.

Hereinafter, exemplary embodiments of the present invention will be described in detail with reference to the accompanying drawings.

However, it should be noted that the present invention is not limited to the embodiments and can be realized in various forms, and that the following embodiments are given by way of illustration to provide a thorough understanding of the invention to those skilled in the art. Therefore, the present invention is defined only by the accompanying claims. Like elements will be denoted by like reference numerals throughout the specification Further, it should be noted that the drawings are not to precise scale and may be exaggerated in thickness of layers, films and/or regions for descriptive convenience and clarity only. When a certain film or layer is described as being formed "on" another film or layer, the certain film or layer may be disposed directly on the other film or layer, or may be disposed above the other film or layer with a third film or layer interposed therebetween.

FIG. 1 is a flowchart of a method of manufacturing a stainless steel separator according to one embodiment of the present invention, and FIGS. 2 to 5 are perspective views illustrating the respective steps of the method shown in FIG. 1.

Figure 2:
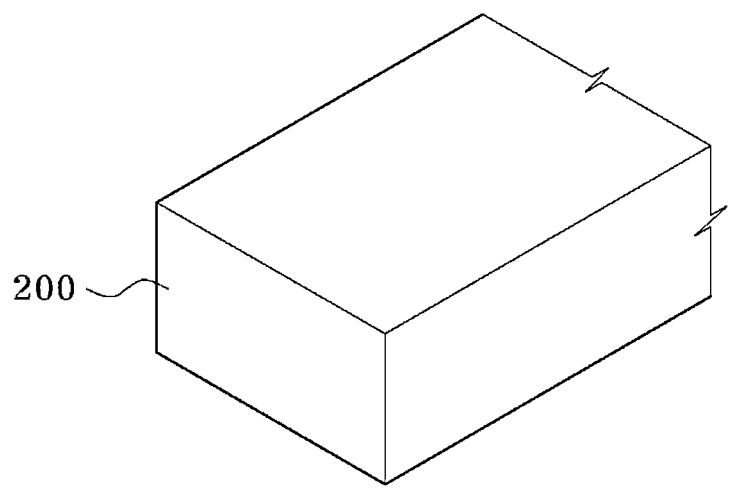
FIGS. 2 to 4 are perspective views illustrating the respective steps of the method shown in FIG. 1.

To manufacture a stainless steel separator according to the embodiment of the invention, a stainless steel sheet 200 is prepared in S110, as shown in FIG. 2.

In this embodiment, the stainless steel sheet 200 is a stainless steel sheet which is readily available in the marketplace and contains 16~28 wt % chromium. Alternatively, the stainless steel sheet may contain about 18 wt % chromium.

Specifically, a matrix of the stainless steel sheet 200 is a stainless steel sheet that comprises 0.08 wt % or less carbon (C), 16~28 wt % chromium (Cr), 0.1~20 wt % nickel (Ni), 0.1~6 wt % molybdenum (Mo), 0.1~5 wt % tungsten (W), 0.1~2 wt % tin (Sn), 0.1~2 wt % copper (Cu), and the balance of iron (Fe) and unavoidable impurities. More specifically, the stainless steel sheet is an austenite stainless steel such as SUS 316L 0.2t.

This operation may include a cleaning process for removing impurities from the surface of the stainless steel sheet 200 using acid and alkali degreasers before performing subsequent surface modification and formation of a coating layer.

Figure 3:
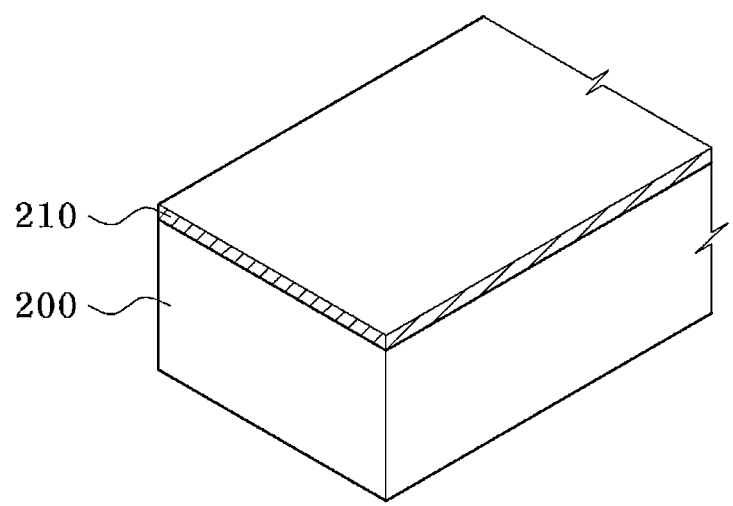

Next, as shown in FIG. 3, the surface of the stainless steel sheet 200 is subjected to surface modification in S120.

Although the stainless steel sheet 200 contains chromium and nickel components exhibiting high corrosion resistance, the stainless steel sheet 200 is mainly composed of iron (Fe).

As a result, in a natural state, the stainless steel sheet 200 tends to react with oxygen in air to form an oxide film on the surface of the stainless steel sheet. Here, since the oxide film is an insulator, it can cause deterioration of the overall electrical conductivity of the stainless steel sheet 200.

Therefore, there is a need for surface modification on the surface of the stainless steel sheet which undergoes deterioration in corrosion resistance.

In other words, the surface modification is performed for selectively etching only the iron component (Fe) in a superficial layer of the stainless steel sheet 200.

After the surface modification, the surface of the stainless steel sheet 200 becomes a Cr-rich passive film 210. The Cr-rich passive film 210 contains 20~75 wt % chromium and 30 wt % or less iron, and has a (Cr+Ni)/Fe ratio of 1 or more as expressed by a ratio of main components in the Cr-rich passive film 210.

Here, the selective metal dissolution can be accomplished because iron oxide in the superficial oxide film can be easily dissolved in an acid whereas chromium oxide therein is more stable than the iron oxide and does not easily dissolve in acids.

Next, a solution and conditions for the surface modification will be described.

A surface modification solution comprises 5~20 wt % pure nitric acid ($HNO_3$), 2~15 wt % pure sulfuric acid ($H_2SO_4$), and the balance of water. The surface modification may be performed at 50~80° C. for an immersion duration of 30 seconds to 30 minutes or less. Here, the surface modification may be performed for 30 seconds to 10 minutes or less while adjusting the concentrations of the nitric acid and the sulfuric acid in consideration of productivity according to treatment duration.

According to one embodiment of this invention, the surface modification solution may be prepared by adding one or both of oxalic acid ($C_2H_2O_4$) and hydrogen peroxide ($H_2O_2$) to the aforementioned surface modification solution (nitric acid+sulfuric acid) to accelerate a metal dissolution rate on the surface of the stainless steel sheet.

Further, for the surface modification, an electrochemical process may be carried out by applying an SHE potential of greater than 0.0 to 1.0 V to the stainless steel sheet which has been immersed in the surface modification solution comprising sulfuric acid ($H_2SO_4$), thereby enabling selective dissolution of Fe in a further reduced period of time.

With the surface modification, a large amount of Fe and a part of Ni content are selectively dissolved to reduce the amount of Fe in the superficial layer of the stainless steel sheet without substantially dissolving chromium (Cr) therein, so that the chromium and nickel components are concentrated on the superficial layer of the stainless steel sheet.

After the surface modification, the Cr-rich passive film 210 may have a thickness of 5~100 nm.

Figure 4:
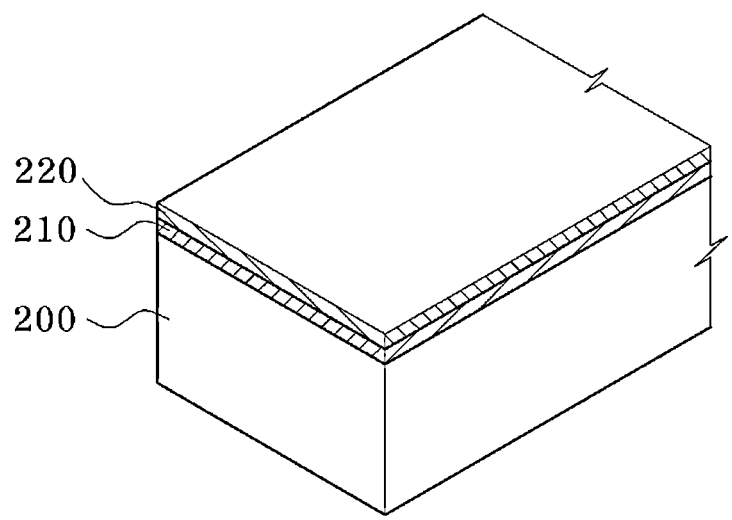
Figure 5:
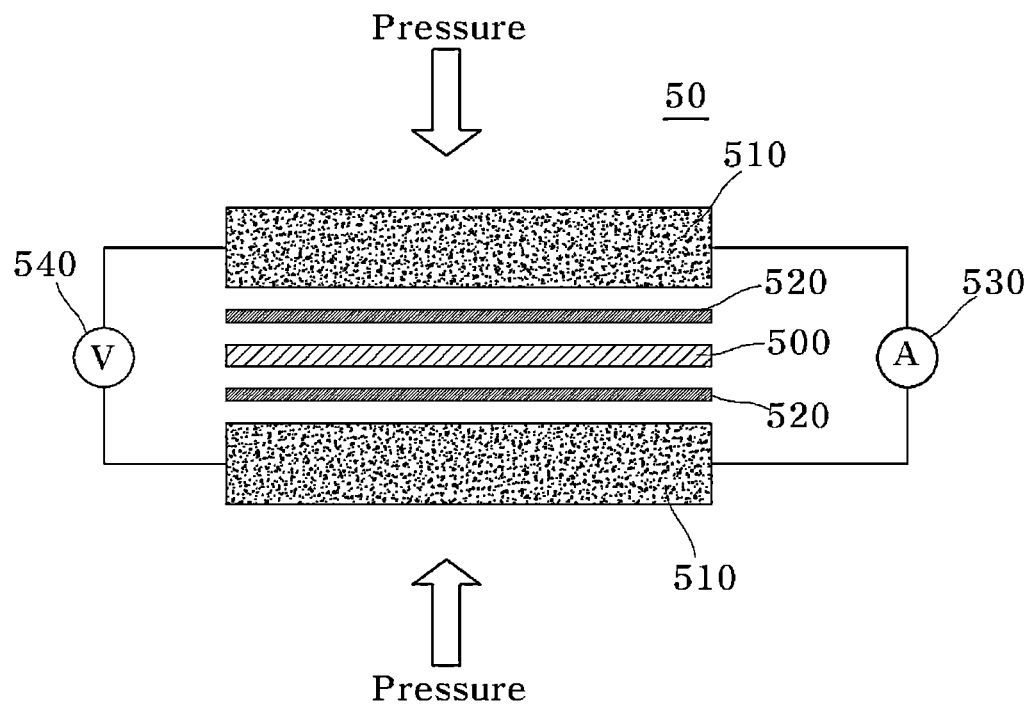
FIG. 5 is a cross-sectional view of a contact resistance tester for measuring contact resistance of a stainless steel sheet according to the present invention.

Next, a coating layer is formed on the Cr-rich passive film 210 in S130, as shown in FIGS. 4 and 5.

The coating layer 220 may be selected from a metal nitride layer ($MN_x$), a metal/metal nitride layer ($M/MN_x$), a metal carbide layer ($MC_y$), and a metal boride layer ($MB_z$). The formation of the coating layer is performed for the following reasons.

When the stainless steel sheet 200 is modified, the Cr-rich passive film 210 is formed on the stainless steel sheet as described above, thereby ensuring superior corrosion resistance and electrical conductivity at an initial stage.

However, when a surface-modified stainless steel separator is exposed for long durations to high temperature-high humidity conditions of a fuel cell, the passive film is gradually thickened. Here, since the passive film mainly consists of metallic oxides, the stainless steel separator undergoes deterioration in electrical conductivity after a predetermined operating period even though the corrosion resistance is maintained.

Accordingly, the coating layer 220 selected from the metal nitride layer ($MN_x$), the metal/metal nitride layer ($M/MN_x$), the metal carbide layer ($MC_y$) and the metal boride layer ($MB_z$) and having both superior corrosion resistance and superior electrical conductivity is formed on the Cr-rich passive film 210, so that the separator for the fuel cell can be prepared to have superior corrosion resistance and superior electrical conductivity not only at an initial operating stage but also after long-term operation.

Here, metal (M) constituting the coating layer 220, which is selected from the metal nitride layer ($MN_x$), the metal/metal nitride layer ($M/MN_x$), the metal carbide layer ($MC_y$) and the metal boride layer (MBA may be selected from transition metals, which have both superior corrosion resistance and superior electrical conductivity in nitride form. Specifically, the metal may selected from chromium (Cr), titanium (Ti), zirconium (Zr), and tungsten (W) (where $0.5 \leq x \leq 1$, $0.42 \leq y \leq 1$, $0.5 \leq z \leq 2$).

The coating layer 220 may have a thickness of 30~300 nm, and preferably a thickness of 30~100 nm. The coating layer having a thickness less than 30 nm provides insignificant effects, whereas the coating layer having a thickness greater than 300 nm deteriorates productivity due to a high price of a metal target and a long-term process.

The coating layer 220 selected from the metal nitride layer ($MN_x$), the metal/metal nitride layer ($M/MN_x$), the metal carbide layer ($MC_y$) and the metal boride layer ($MB_z$) may be obtained, without limitation, by arc ion plating or physical vapor deposition such as sputtering and the like.

In this embodiment, since reactive sputtering permits easy control of the process, the reactive sputtering is used for forming the coating layer 220 selected from the metal nitride layer ($MN_x$), the metal/metal nitride layer ($M/MN_x$), the metal carbide layer ($MC_y$) and the metal boride layer ($MB_z$).

Examples of the metal (M) constituting the coating layer 220 selected from the metal nitride layer ($MN_x$), the metal/metal nitride layer ($M/MN_x$), the metal carbide layer ($MC_y$) and the metal boride layer ($MB_z$) include chromium (Cr), titanium (Ti), zirconium (Zr), and tungsten (W).

Although sputtering is used in this embodiment, other processes may also be used to form the coating layer 220.

To form the coating layer 220, a metal target having a purity of 99.99% or more may be used as a sputtering target.

A technique for forming the coating layer by sputtering will be described in more detail. After the stainless steel sheet 200 and the metal target are loaded in a sputtering chamber, sputtering is performed in an atmosphere of argon and nitrogen ($Ar+N_2$) gas to form the coating layer 220 on the passive film 210 of the stainless steel sheet.

When forming a coating layer consisting of two layers of M/MNx, argon gas is supplied alone to form a metal layer (M), followed by supplying the argon and nitrogen ($Ar+N2$) gas to form a $MN_x$ layer continuous with the metal layer (M), so that the two layer of $M/MN_x$ can be continuously formed.

As such, in this process, the sputtering is performed in an argon gas atmosphere when forming the metal layer (M), and is then performed in the atmosphere of argon and nitrogen ($Ar+N_2$) gas when forming the metal nitride layer ($MN_x$).

In more detail, referring to FIG. 4, the coating layer 220 is formed in a continuous film shape on the passive film 210.

Examples and Comparative Examples

Next, a description of the present invention will be given with reference to inventive and comparative examples to show that a stainless steel separator for fuel cells manufactured by the method according to the embodiment of this invention has excellent corrosion resistance and contact resistance. A description of details apparent to those skilled in the art will be omitted herein.

TABLE 1

| | | Pickling | | | CrN coating | | | |
| | | | | | Coating | | Corrosion | |
| | Process | Temp. (° C.) | Time (min) | Composition | layer design | Thickness (nm) | rate ($\mu A/cm^2$) | CR ($m\Omega cm^2$) |
|---|---|---|---|---|---|---|---|---|
| E1 | IM | 60 | 3 | 15% $HNO_3$ + 10% $H_2SO_4$ | CrN | 30 | 0.75 | 14.6 |
| E2 | IM | 60 | 3 | 5% $HNO_3$ + 5% $H_2SO_4$ + 5% Oxalic | CrN | 50 | 0.72 | 15.1 |
| E3 | IM | 60 | 3 | 5% $HNO_3$ + 5% $H_2SO_4$ + 5% $H_2O_2$ | CrN | 50 | 0.73 | 14.9 |
| E4 | IM | 60 | 3 | 10% $HNO_3$ + 5% $H_2SO_4$ + 5% $H_2O_2$ | Cr/CrN multilayer | 300 | 0.58 | 14.3 |
| E5 | EC | 60 | 100 | 1M $H_2SO_4$ | CrN | 50 | 0.76 | 14.6 |
| E6 | EC | 60 | 100 | 1M $H_2SO_4$ | Cr/CrN multilayer | 100 | 0.79 | 15.2 |
| E7 | EC | 60 | 100 | 1M $H_2SO_4$ | CrN | 100 | 0.82 | 14.3 |
| E8 | EC | 60 | 100 | 1M $H_2SO_4$ | TiN | 100 | 0.74 | 14.9 |

E = Example,
IM = Immersion process,
EC = Electrochemical process,
CR: Contact resistance Tables 1, 2 and 3 show corrosion currents and contact resistances of stainless steel separators of Examples 1 to 18 and Comparative Examples prepared using stainless steel 316 L as matrices of the stainless steel separators via the immersion process and the electrochemical process under different conditions for surface modification (temperature, time, current density, and solution composition) and under different conditions (kind, design, and thickness of coating layer) in formation of a coating layer.

TABLE 2

| | | Pickling | | | CrN coating | | Corrosion | |
|---|---|---|---|---|---|---|---|---|
| | Process | Temp. (° C.) | Time (min) | Composition | Coating layer design | Thickness (nm) | rate ($\mu$A/cm$^2$) | CR (m$\Omega$cm$^2$) |
| E9 | EC | 60 | 100 | 1M H$_2$SO$_4$ | ZrN | 100 | 0.81 | 13.8 |
| E10 | IM | 60 | 3 | 15% HNO$_3$ + 10% H$_2$SO$_4$ | Cr$_2$N | 100 | 0.89 | 13.9 |
| E11 | IM | 60 | 3 | 15% HNO$_3$ + 10% H$_2$SO$_4$ | TiC | 100 | 0.85 | 16.1 |
| E12 | IM | 60 | 3 | 15% HNO$_3$ + 10% H$_2$SO$_4$ | ZrC | 100 | 0.81 | 16.6 |
| E13 | IM | 60 | 3 | 15% HNO$_3$ + 10% H$_2$SO$_4$ | Cr$_3$C$_2$ | 100 | 0.83 | 16.9 |
| E14 | IM | 60 | 3 | 15% HNO$_3$ + 10% H$_2$SO$_4$ | Cr$_7$C$_3$ | 100 | 0.84 | 16.6 |
| E15 | IM | 60 | 3 | 15% HNO$_3$ + 10% H$_2$SO$_4$ | CrB$_2$ | 100 | 0.92 | 15.9 |
| E16 | IM | 60 | 3 | 15% HNO$_3$ + 10% H$_2$SO$_4$ | TiB$_2$ | 100 | 0.85 | 16.1 |

E = Example,
IM = Immersion process,
EC = Electrochemical process,
CR: Contact resistance Specifically, Examples 1 to 7, and 10 were subjected to both surface modification and formation of a chromium nitride layer (CrN or Cr$_2$N) (Examples 4 and 6 had Cr/CrN multiple layers). Examples 8, 9 and 11 to 18 were formed with coating layers of titanium nitride, titanium carbide and titanium boride (TiN, TiC and TiB$_2$), zirconium nitride, zirconium carbide and zirconium boride (ZrN, ZrC and ZrB$_2$), chromium carbide and chromium boride (Cr$_3$C$_2$, Cr$_7$C$_3$ or CrB$_2$), and tungsten carbide (WC), respectively. Comparative Example 1 was formed with a coating layer of chromium nitride (CrN) having a thickness of 15 nm which is greater than the thickness of the coating layer 220 according to the present invention. Comparative Example 2 was subjected only to surface modification without the formation of the coating layer, and Comparative Example 3 was formed with only a chromium nitride (CrN) layer without the surface modification.

of a stainless steel sheet 500, a modified Davies method was used to measure contact resistance between stainless steel (SS) and two pieces of carbon paper.

The contact resistance was measured based on the principle of measuring four-wire current-voltage via a contact resistance tester available from Model IM6 from Zahner Inc.

Measurement of the contact resistance was performed by application of DC 2 A and AC 0.2 A to a measuring target in a constant current mode at a frequency in the range of 10 kHz to 10 mHz.

The carbon paper was 10 BB available from SGL Inc.

In the contact resistance tester 50, a sample 500 was disposed between two pieces of carbon paper 520 and copper plates 510 connected to both a current supplier 530 and a voltage tester 540.

TABLE 3

| | | Pickling | | | CrN coating | | Corrosion | |
|---|---|---|---|---|---|---|---|---|
| | Process | Temp. (° C.) | Time (min) | Composition | Coating layer design | Thickness (nm) | rate ($\mu$A/cm$^2$) | CR (m$\Omega$cm$^2$) |
| E17 | IM | 60 | 3 | 15% HNO$_3$ + 10% H$_2$SO$_4$ | ZrB$_2$ | 100 | 0.81 | 16.6 |
| E18 | IM | 60 | 3 | 15% HNO$_3$ + 10% H$_2$SO$_4$ | WC | 100 | 0.86 | 17.6 |
| CE1 | IM | 60 | 3 | 15% HNO$_3$ + 10% H$_2$SO$_4$ | CrN | 15 | 0.94 | 17.3 |
| CE2 | EC | 60 | 100 | 1M H$_2$SO$_4$ | — | — | 0.95 | 17.5 |
| CE3 | — | — | — | — | CrN | 30 | 2.3 | 35 |

E = Example,
IM = Immersion process,
EC = Electrochemical process,
CR: Contact resistance 1. Measurement of Contact Resistance FIG. 5 is a cross-sectional view of a contact resistance tester for measuring contact resistance of a stainless steel separator according to one embodiment of the present invention.

Referring to FIG. 5, in order to obtain optimized parameters for cell assembly for measurement of contact resistance Voltage was measured by applying DC 2 A/AC 0.2 A to the sample 500 using a current supplier 530 (Model IM6 from Zahner Inc.).

Then, the sample 500, carbon paper 520, and copper plates 510 were compressed to form a stacked structure from both copper plates 510 of the contact resistance tester 50 using a pressure regulator (Model No. 5566 from Instron Inc., compression maintaining test). Using the pressure regulator, a pressure of 50~150 N/cm² was applied to the contact resistance tester 50.

The contact resistances of samples 500, that is, stainless steel sheets, of the inventive and comparative examples shown in Tables 1 and 2 were measured using the contact resistance tester 50 prepared as described above.

2. Measurement of Corrosion Current Density

A corrosion current density of the stainless steel sheet according to the present invention was measured using EG&G Model No. 273A as a corrosion current tester. Tests for corrosion durability were performed in a simulated environment of a polymer electrolyte fuel cell (PEFC).

After being etched at 80° C. using 0.1N $H_2SO_4$+2 ppm HF as an etching solution, the samples were subjected to $O_2$ bubbles for 1 hour, and the corrosion current density thereof was measured at an open circuit potential (OCP) of −0.25V~1V vs. SCE.

Other properties were measured at −0.24V vs. SCE for a PEFC anode environment and at 0.6V vs. SCE for a PEFC cathode environment.

Here, the measured properties were evaluated based on data of corrosion current at 0.6V vs. SCE in a simulated cathode environment of a fuel cell.

The anode environment is an environment in which hydrogen is split into hydrogen ions and electrons while passing through a membrane electrode assembly (MEA), and the cathode environment is an environment in which oxygen combines with the hydrogen ions to produce water while passing through the MEA.

Since the cathode environment has a high potential and is very corrosive, it is desirable that the corrosion resistance be tested in the cathode environment.

Further, it is desirable that the stainless steel sheet have a corrosion current density of 1 μA/cm² or less for application to the PEFC.

3. Analysis of Measurement Results of Corrosion Current Density and Contact Resistance It can be seen from Tables 1 to 3 that, when the samples were subjected to surface modification and were formed with metal coating layers as in the inventive examples, the samples had a corrosion current density of 0.5~1.0 μA/cm² and a contact resistance of 13~18 mΩ·cm².

Comparative Example 1 having a 15 nm thick chromium nitride layer formed after the surface modification had a contact resistance of 17.4 mΩ·cm² and a corrosion current density of 0.94 μA/cm². Comparative Example 2 subjected only to the surface modification had a contact resistance of 17.5 mΩ·cm² and a corrosion current density of 0.95 μA/cm². Comparative Example 3 formed with a chromium nitride layer without the surface modification had a contact resistance of 35 mΩ·cm² and a corrosion current density of 2.3 μA/cm².

Although the inventive examples and comparative examples had contact resistances and corrosion current densities satisfying the standards of the DOE, these values were merely initial values before long-term operation of a fuel cell, and it can be seen that a difference between the inventive examples and comparative examples is significant in evaluation of long-term durability of the fuel cell described below.

4. Evaluation and Result of Corrosion Resistance and Contact Resistance in Simulated Fuel Cell Environment (1) Evaluation of Corrosion Resistance and Contact Resistance in a Simulated Environment For a simulated fuel cell environment to test a stainless steel separator according to one embodiment of this invention, EG&G Model No. 273A was used. After being immersed in 0.1N $H_2SO_4$+2 ppm HF at 80° C., samples were subjected to $O_2$ bubbles for 1 hour, followed by application of a constant voltage of 0.6V vs. SCE. After applying the constant voltage for a predetermined duration, the corrosion resistance and contact resistance of each sample were measured. While repeating this operation, the variation in corrosion resistance and contact resistance in the simulated fuel cell environment over an extended period of time was evaluated.

(2) Evaluation Results

Figure 6:
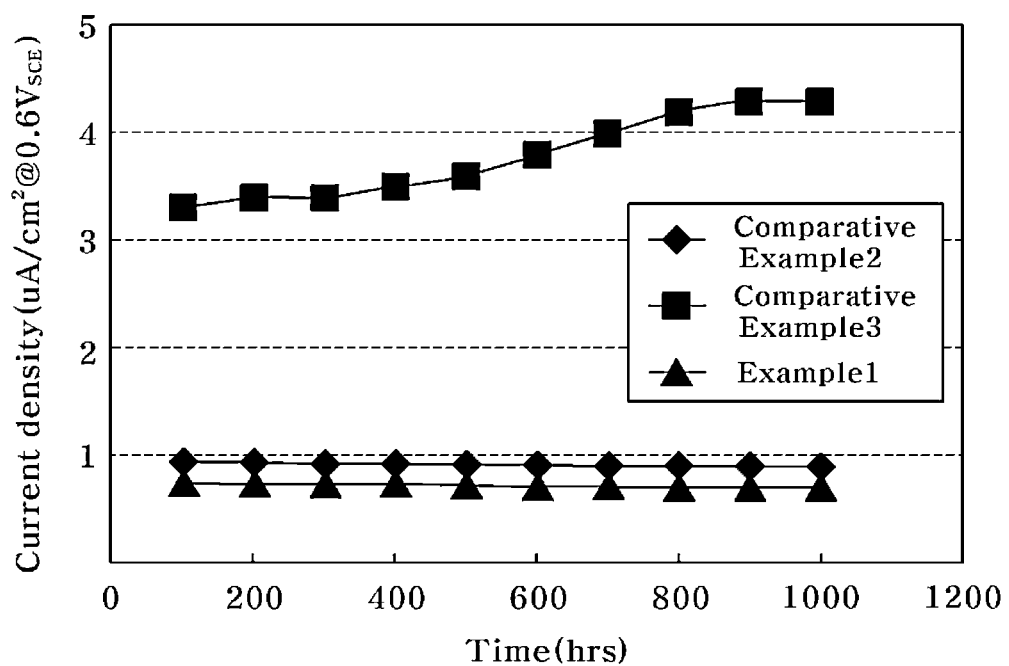
FIG. 6 is a graph depicting results of evaluating corrosion resistance of Example 1 and Comparative Examples 2 and 3 in a simulated fuel cell environment.

FIG. 6 is a graph depicting results of evaluating the corrosion resistance and the contact resistance in the simulated fuel cell environment by the method as described above.

Referring to FIG. 6, Example 1 and Comparative Example 2 had a corrosion current density of 1 μA/cm² not only at an initial stage but also after 1,000 hours, whereas Comparative Example 3 had a corrosion current density exceeding 1 μA/cm² not only at an initial stage but also after a long time. It was considered that such a high corrosion current density of Comparative Example 3 was caused by exfoliation of the CrN layer.

Figure 7:
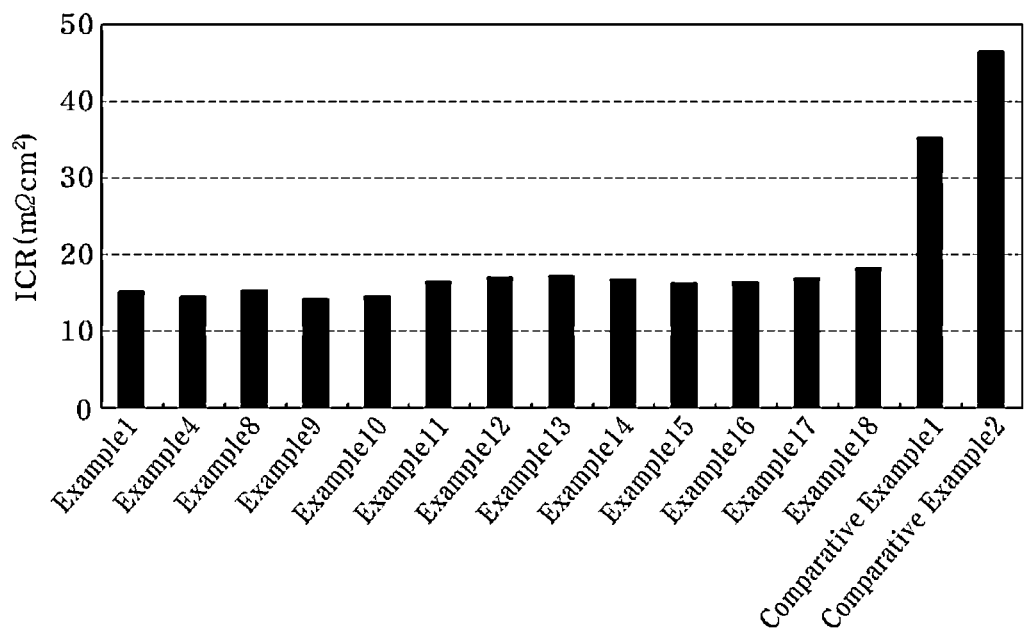
FIG. 7 is a graph depicting results of evaluating contact resistance of Examples 1, 4, 8 to 18 and Comparative Examples 1 and 2 in a simulated fuel cell environment.

FIG. 7 is a graph depicting results of evaluating the contact resistance of Examples 1, 4, 8 to 18 and Comparative Examples 1 and 2 exposed to a simulated fuel cell environment for 2,000 hours.

Referring to FIG. 7, Examples 1, 4, 8 to 18 had contact resistances satisfying the standards of the DOE even after 2,000 hours, whereas Comparative Examples 1 and 2 had corrosion resistances exceeding the standards of the DOE after 2,000 hours.

With regard to such high contact resistances of the comparative examples, it was considered that Comparative Example 1 underwent exfoliation of the CrN layer or growth of the passive film above the thickness of the CrN layer, and that Comparative Example 2 underwent continuous growth of the passive film. On the other hand, for the inventive examples, it was considered that a metal compound layer formed on the surface of each separator efficiently served as a corrosion resistant and electrically conductive coating layer suppressing the growth of the passive film under the metal compound layer.

5. Evaluation and Result of Long-Term Durability of Fuel Cell (1) Evaluation of Long-Term Durability Separators, each having a serpentine passage for supplying reaction gas, were used. Each fuel cell was prepared by interposing a membrane electrode assembly (Model 5710 from Gore Fuel Cell Technologies, Inc.) and a gas diffusion layer (Model 10BA from SGL Co., Ltd.) between the separators and compressing the same with a predetermined pressure.

Performance of each of the fuel cells was evaluated using a unit cell. NSE Test Station 700W class was used as a fuel cell operator, and KIKUSUI E-Load was used as an electronic load for evaluating the performance of the fuel cell. Current cycles of 0.01 A/cm² current for 15 seconds and 1 A/cm² current for 15 seconds were constantly applied.

As the reaction gas, hydrogen and air were supplied at a flux with a stoichiometric ratio of $H_2$ to air of 1.5:2.0 according to the electric current after being humidified to a relative humidity of 100%. The performance of the fuel cell was evaluated at atmospheric pressure while maintaining the temperature of a humidifier and the cell at 65° C. An active area was 25 of and an operating pressure was 1 atm.

(2) Evaluation Results of Long-Term Durability

Figure 8:
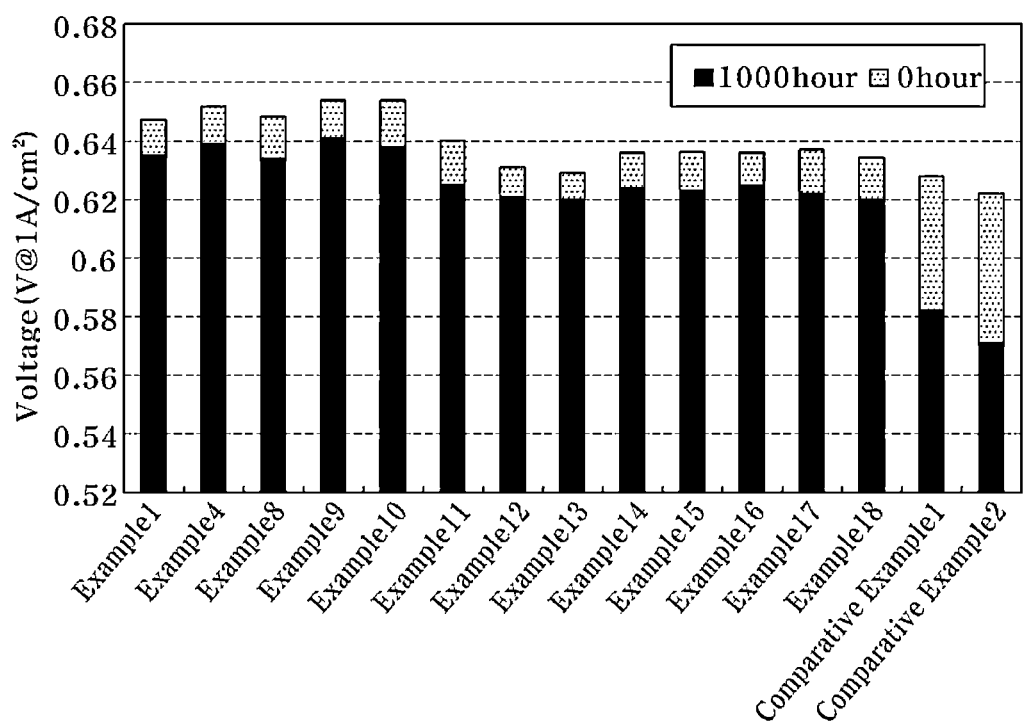
FIG. 8 is a graph depicting results of evaluating long-term durability of Examples 1, 4, 8 to 18 and Comparative Example 1 in a simulated fuel cell environment.

FIG. 8 is a graph depicting results of evaluating the long-term durability of Examples 1, 4 and 8 to 18, and Comparative Examples 1 and 2 by the method as described above.

Referring to FIG. 8, although all of the samples generated a voltage of about 0.62 V or more at an initial stage, Comparative Example 1 generated a decreased voltage of about 0.58 V after 2,000 hours and Comparative Example 2 generated a decreased voltage of about 0.57 V after 2,000 hours.

Fuel cells including the stainless steel separators of Examples 1, 4 and 8 to 18 experienced a minute reduction of voltage less than 0.02 V even after 2,000 hours due to superior durability of the stainless steel separators.

Figure 9:
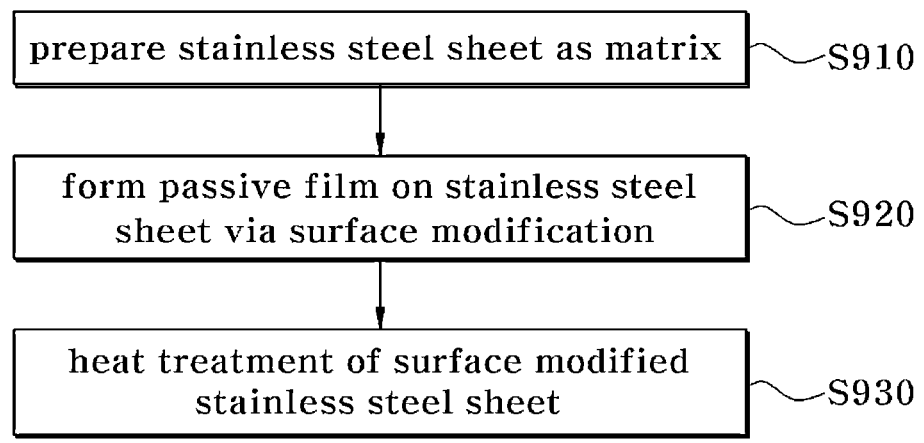
FIG. 9 is a flowchart of a method of manufacturing a stainless steel separator according to another embodiment of the present invention.

FIG. 9 is a flowchart of a method of manufacturing a stainless steel separator according to another embodiment of the present invention.

To manufacture a stainless steel separator according to this embodiment of the invention, a stainless steel sheet is prepared in S910.

In this embodiment, the stainless steel sheet is a stainless steel sheet which is readily available in the marketplace and contains 16~28 wt % chromium. Alternatively, the stainless steel sheet may contain about 18 wt % chromium.

Specifically, a matrix of the stainless steel separator is a stainless steel sheet that comprises 0.08 wt % or less carbon (C), 16~28 wt % chromium (Cr), 0.1~20 wt % nickel (Ni), 0.1~6 wt % molybdenum (Mo), 0.1~5 wt % tungsten (W), 0.1~2 wt % tin (Sn), 0.1~2 wt % copper (Cu), and the balance of iron (Fe) and unavoidable impurities. More specifically, the stainless steel sheet is an austenite stainless steel such as SUS 316L 0.2t.

This operation may include a cleaning process for removing impurities from the surface of the stainless steel sheet using acid and alkali degreasers before performing subsequent surface modification and formation of a coating layer.

Next, the surface of the stainless steel sheet is subjected to surface modification in S920.

Although the stainless steel sheet contains chromium and nickel components exhibiting high corrosion resistance, the stainless steel sheet is mainly composed of iron (Fe).

As a result, in a natural state, the stainless steel sheet tends to react with oxygen in air to form an oxide film on the surface thereof. Here, since the oxide film is an insulator, it can cause deterioration of the overall electrical conductivity of the stainless steel sheet.

Therefore, there is a need for surface modification on the surface of the stainless steel sheet which undergoes deterioration in corrosion resistance.

In other words, the surface modification is performed for selectively etching only the iron component (Fe) in a superficial layer of the stainless steel sheet.

After the surface modification, the surface of the stainless steel sheet becomes a Cr-rich passive film. The Cr-rich passive film contains 20~75 wt % chromium and 30 wt % or less iron, and has a (Cr+Ni)/Fe ratio of 1 or more as expressed by a ratio of main components in the Cr-rich passive film.

Here, the selective metal dissolution can be accomplished because iron oxide in the superficial oxide film can be easily dissolved in an acid whereas chromium oxide therein is more stable than the iron oxide and does not easily dissolve in acids.

Next, a solution and conditions for the surface modification will be described.

A surface modification solution comprises 5~20 wt % pure nitric acid ($HNO_3$), 2~15 wt % pure sulfuric acid ($H_2SO_4$), and the balance of water. The surface modification may be performed at 50~80° C. for an immersion duration of 30 seconds-30 minutes or less. Here, the surface modification may be performed for 30 seconds-10 minutes or less while adjusting the concentrations of the nitric acid and the sulfuric acid in consideration of productivity according to treatment duration.

According to one embodiment of this invention, the surface modification solution may be prepared by adding one or both of oxalic acid ($C_2H_2O_4$) and hydrogen peroxide ($H_2O_2$) to the aforementioned surface modification solution (nitric acid+ sulfuric acid) to accelerate a metal dissolution rate on the surface of the stainless steel sheet.

Further, for the surface modification, an electrochemical process may be carried out by applying an SHE potential of greater than 0.0 to 1.0 V to the stainless steel sheet which has been immersed in the surface modification solution comprising sulfuric acid ($H_2SO_4$), thereby enabling selective dissolution of Fe in a further reduced period of time.

With the surface modification, a large amount of Fe and a part of Ni content are selectively dissolved to reduce the amount of Fe in the superficial layer of the stainless steel sheet without substantially dissolving chromium (Cr) therein, so that the chromium and nickel components are concentrated on the superficial layer of the stainless steel sheet.

After the surface modification, the Cr-rich passive film may have a thickness of 5~100 nm.

Next, the stainless steel sheet subjected to the surface modification and having the passive film on the surface thereof is heat-treated in S930.

The heat treatment is performed for the following reasons.

When the stainless steel sheet is subjected to the surface modification, the Cr-rich passive film is formed on the surface of the stainless steel sheet as described above, thereby ensuring superior corrosion resistance and electrical conductivity at an initial stage.

However, when the surface-modified stainless steel separator is exposed for long durations to high temperature-high humidity conditions of a fuel cell, the passive film is gradually thickened. Since the passive film mainly consists of metallic oxides, the stainless steel separator can suffer deterioration in electrical conductivity after a predetermined operational period even though the corrosion resistance thereof can be maintained.

Accordingly, the separator for the fuel cell can be prepared to have superior corrosion resistance and electrical conductivity not only at an initial operating stage of the fuel cell but also after long-term operation thereof through heat treatment for suppressing the growth of the passive film even after long-term operation while ensuring both superior corrosion resistance and electrical conductivity on the Cr-rich passive film.

The heat treatment may be performed under vacuum, in air, or in an inert gas (for example, nitrogen, argon, helium, hydrogen, etc.) atmosphere at a temperature of 100~300° C., and preferably at a temperature of 100~200° C.

Heat treatment at a temperature of 100° C. or less provides an insignificant effect upon the stainless steel sheet. On the other hand, if the heat treatment is performed above 300° C., oxidation occurs on the surface of the stainless steel sheet, deteriorating the properties thereof, and it is also undesirable in view of manufacturing costs.

Although a heat treatment period is not specifically limited, the heat treatment is advantageously performed for 3 minutes or more. Further, the heat treatment may be performed for 1 hour or less when taking into consideration a temperature increasing time and costs.

In all examples of the present inventions described below, the heat treatment was performed for 30 minutes.

The heat treatment may be performed in a batch-type manner or a continuous line manner in a furnace.

The stainless steel separator for fuel cells manufactured by the method according to this embodiment of the invention, that is, through the surface modification and heat treatment, has a corrosion current density of 1 µA/cm² or less and a contact resistance of 20 mΩ·cm² or less on both surfaces, which satisfy the standards of the DOE.

Examples and Comparative Examples

2. Measurement of Corrosion Current Density

The corrosion current density was measured by the same method as in Examples 1 to 18.

3. Analysis of Measurement Results of Corrosion Current Density and Contact Resistance

TABLE 4

| | | Surface modification | | | Heat treatment | | | Corrosion | |
|---|---|---|---|---|---|---|---|---|---|
| | Process | Temp. (° C.) | Time (current density) (min) | Comp. | Atm. | Time (min) | Temp. (° C.) | rate (µA/cm²) | CR (mΩ · cm²) |
| E19 | IM | 60 | 3 | 15% HNO$_3$ + 10% H$_2$SO$_4$ | Vacuum (1 * 10$^{-3}$ torr) | 30 | 200 | 0.54 | 12.2 |
| E20 | EC | 60 | (100) | 1M H$_2$SO$_4$ | Vacuum (1 * 10$^{-3}$ torr) | 30 | 100 | 0.62 | 13.8 |
| E21 | EC | 60 | (100) | 1M H$_2$SO$_4$ | N$_2$ | 30 | 200 | 0.61 | 12.8 |
| E22 | EC | 60 | (100) | 1M H$_2$SO$_4$ | N$_2$ | 30 | 100 | 0.67 | 14.5 |
| E23 | EC | 60 | (100) | 1M H$_2$SO$_4$ | Ar | 30 | 200 | 0.59 | 12.5 |
| E24 | EC | 60 | (100) | 1M H$_2$SO$_4$ | Ar | 30 | 100 | 0.64 | 14.1 |
| E25 | EC | 60 | (100) | 1M H$_2$SO$_4$ | Air | 30 | 100 | 0.57 | 17.5 |
| E26 | EC | 60 | (100) | 1M H$_2$SO$_4$ | Air | 30 | 200 | 0.49 | 17.6 |
| E27 | EC | 60 | (100) | 1M H$_2$SO$_4$ | Air | 30 | 300 | 0.43 | 17.8 |
| CE4 | EC | 60 | (100) | 1M H$_2$SO$_4$ | — | — | — | 0.95 | 17.5 |
| CE5 | EC | 60 | (100) | 1M H$_2$SO$_4$ | Air | 30 | 400 | 0.35 | 23.3 |
| CE6 | EC | 60 | (100) | 1M H$_2$SO$_4$ | Air | 1 | 100 | 0.95 | 17.4 |
| CE7 | EC | 60 | (100) | 1M H$_2$SO$_4$ | Air | 1 | 200 | 0.94 | 17.4 |
| CE8 | EC | 60 | (100) | 1M H$_2$SO$_4$ | Air | 2 | 300 | 0.94 | 17.3 |

E = Example,
CE = Comparative Example,
IM = immersion process,
EC = electrochemical process,
Atm.: atmosphere,
CR: Contact resistance Table 4 shows corrosion currents and contact resistances of stainless steel separators of Examples 19 to 27 and Comparative Examples 4 to 8 prepared using stainless steel 316 L as matrices of the stainless steel sheet separators under different conditions for surface modification (temperature, time, and composition of solution), heat treatment (atmosphere and temperature) by an immersion process and an electrochemical process.

Specifically, Examples 19 and 20 were subjected to surface modification and heat treatment in a vacuum of 1×10$^{-3}$ torr. Examples 21 and 22 were subjected to surface modification and heat treatment in a nitrogen atmosphere. Examples 23 and 24 were subjected to surface modification and heat treatment in an argon atmosphere as a Group 0 inert gas atmosphere. Examples 25 to 27 were subjected to surface modification and heat treatment in air.

Comparative Example 4 was subjected to surface modification without heat treatment, and Comparative Example 5 was subjected to surface modification and heat treatment in air at a temperature of 400° C. which did not satisfy the conditions of the present invention. Comparative Examples 6 to 8 were subjected to surface modification and heat treatment in air for 1 minute and 2 minutes, respectively, which did not satisfy the conditions of the present invention.

1. Measurement of Contact Resistance

The contact resistances of samples 500, that is, stainless steel sheets, of the inventive and comparative examples shown in Table 4 were measured using the contact resistance tester 50 as shown in FIG. 5.

Referring to Table 4, it can be understood that, when the samples were subjected to the surface modification and heat treatment satisfying the conditions of the present invention as in the inventive examples, all of the samples had a corrosion current density of 0.5~0.7 µA/cm² and a contact resistance of 12~18 mΩ·cm², all of which satisfy the standards set by the DOE.

Comparative Example 4 subjected to the surface modification without the heat treatment had a contact resistance of 17.5 mΩ·cm² and a corrosion current density of 0.95 µA/cm², and Comparative Example 5 subjected to the surface modification and the heat treatment in air at a higher temperature than that of the present invention had a contact resistance of 23.3 mΩ·cm² and a corrosion current density of 0.35 µA/cm². Comparative Examples 6 to 8 subjected to the surface modification and the heat treatment in air for 1 minute had a contact resistance of 17.3~17.4 mΩ·cm² and a corrosion current density of 0.94~0.95 µA/cm².

Here, although Comparative Examples 4, 6 to 8 had the contact resistance and the corrosion current satisfying the standards of the DOE, these values were merely initial values before long-term operation of a fuel cell, and it can be understood that a difference between the inventive examples and Comparative Example 4 is significant in evaluation of long-term durability of the fuel cell described below.

4. Evaluation and Results of Corrosion Resistance and Contact Resistance in Simulated Fuel Cell Environment (1) Evaluation of Corrosion Resistance and Contact Resistance in a Simulated Fuel Cell Environment The variation in corrosion resistance and contact resistance in a simulated fuel cell environment was evaluated by the same method as in Examples 1 to 18.

Figure 10:
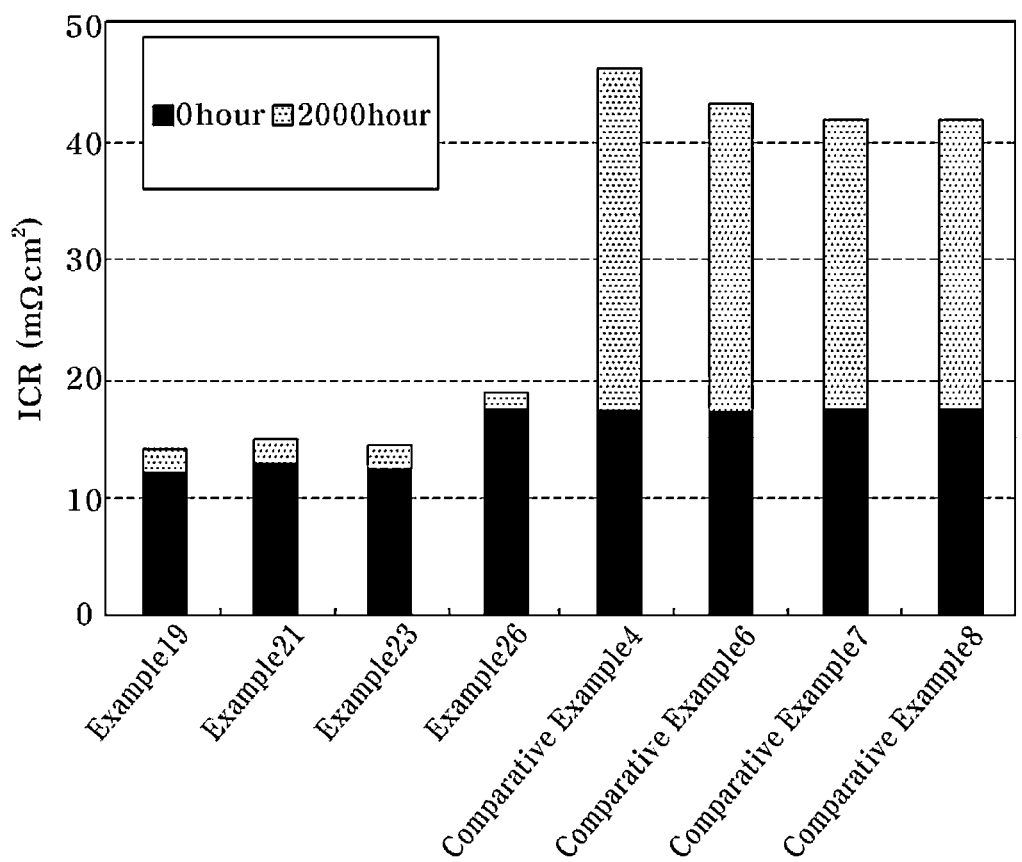
FIG. 10 is a graph depicting results of evaluating contact resistance of Examples 19, 21, 23 and 26, and Comparative Examples 4, 6 to 8 in a simulated fuel cell environment.

(2) Evaluation Results of Contact Resistance and Long-Term Corrosion Resistance in a Simulated Fuel Cell Environment FIG. 10 is a graph depicting evaluation results of the contact resistance measured by the aforementioned method in the simulated fuel cell environment.

Referring to FIG. 10, Examples 19, 21, 23 and 26 had a contact resistance of 20 mΩ·cm$^2$ or less not only at an initial stage (0 hour) but also after 2,000 hours, indicating that the contact resistance thereof was substantially maintained. Conversely, Comparative Examples 4, 6 to 8 had a contact resistance of 17.3~17.5 mΩ·cm$^2$ at an initial stage as described above, but had a contact resistance above 40 mΩ·cm$^2$ after 2,000 hours.

Figure 11:
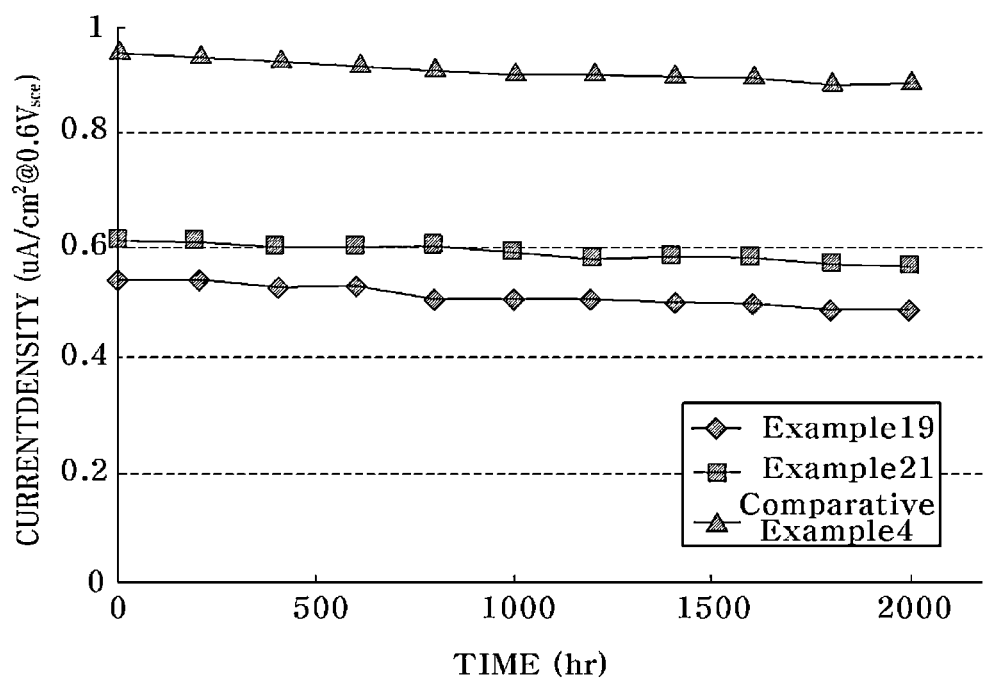
FIG. 11 is a graph depicting results of evaluating corrosion current density of Examples 19 and 21, and Comparative Example 4 exposed to a simulated fuel cell environment for 2,000 hours.

FIG. 11 is a graph depicting results of evaluating corrosion current density of Examples 19 and 21 and Comparative Example 4 exposed to the simulated fuel cell environment for 2,000 hours as described above.

Referring to FIG. 11, all of the samples of Examples 19 and 21 and Comparative Example 4 had corrosion current densities less than or equal to the standards of the DOE not only at an initial stage but also after 2,000 hours.

Therefore, it can be seen that, when the stainless steel sheet was subjected to the surface modification without heat treatment, the stainless steel separator could maintain corrosion resistance but was significantly increased in surface resistance after the long-term operation in the simulated fuel cell environment.

5. Evaluation and Results of Long-Term Durability of Fuel Cell (1) Evaluation Method of Long-Term Durability The long-term durability was evaluated by the same method as in Examples 1 to 18.

(2) Evaluation Results of Long-Term Durability

Figure 12:
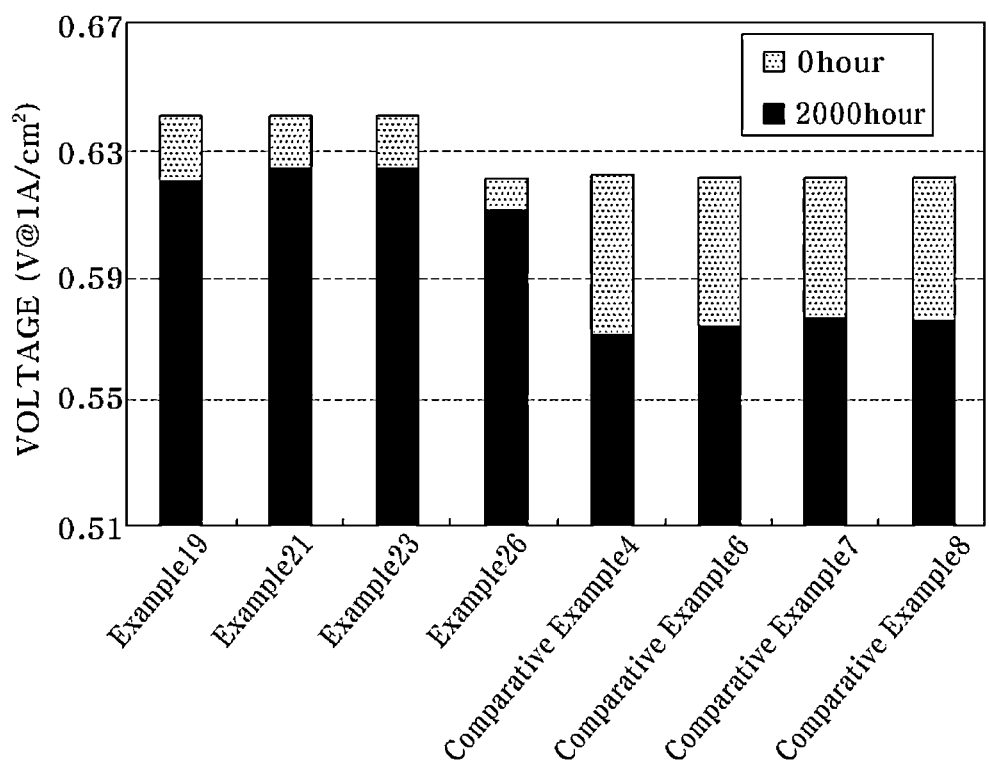
FIG. 12 is a graph depicting results of evaluating long-term durability of Examples 19, 21, 23 and 26, and Comparative Example 4, 6 to 8 in a simulated fuel cell environment.

FIG. 12 is a graph depicting results of evaluating the long-term durability of Examples 19, 21, 23 and 26 and Comparative Examples 4, 6 to 8 by the method as described above.

Referring to FIG. 12, fuel cells of Comparative Examples 4, and 6 to 8 generated a voltage of 0.6 V or more at an initial stage, but generated a decreased voltage of about 0.57 V after 2,000 hours.

On the other hand, all of the fuel cells including the stainless steel separators of Examples 19, 21, 23 and 26 generated a voltage of 0.62 V or more at an initial stage, and experienced a minute reduction of voltage less than 0.02 V even after 2,000 hours due to superior durability of the stainless steel separators.

As apparent from the above description, the stainless steel separator for fuel cells manufactured by the method according to an embodiment of the invention has superior corrosion resistance and electrical conductivity not only at an initial stage but also after long-term use in operational conditions of the fuel cell.

Further, the method according to the embodiment of the present invention enables surface modification for achieving superior properties even with a general inexpensive stainless steel sheet, thereby lowering manufacturing costs of the stainless steel separator.

The stainless steel separator for fuel cells manufactured by the method according to the embodiment of the invention has a corrosion current density of 1 μA/cm$^2$ or less and a contact resistance of 20 mΩ·cm$^2$ or less on both surfaces of the separator.

Although some embodiments have been provided in conjunction with the accompanying drawings to illustrate the present invention, it will be apparent to those skilled in the art that the embodiments are given by way of illustration, and that various modifications and changes can be made without departing from the spirit and scope of the present invention. Accordingly, the scope of the present invention should be limited only by the accompanying claims.

What is claimed is:

1. A method of manufacturing a stainless steel separator for fuel cells, the method comprising:
   preparing a stainless steel sheet as a matrix;
   performing surface modification on a surface of the stainless steel sheet to form a Cr-rich passive film having a comparatively increased amount of Cr in a superficial layer of the stainless steel sheet by decreasing an amount of Fe in the superficial layer of the stainless steel sheet; and
   forming a coating layer on the surface of the surface-modified stainless steel sheet, wherein the coating layer is a metal boride layer (MBz), and 0.5≤z≤2.

2. The method according to claim 1, wherein the metal (M) used in the forming a coating layer is at least one selected from chromium (Cr), titanium (Ti), zirconium (Zr), and tungsten (W).

3. The method according to claim 1, wherein the metal (M) used in the forming a coating layer is selected from transition metals.

4. The method according to claim 1, wherein the Cr-rich passive film constituting the superficial layer of the stainless steel sheet has a (Cr+Ni)/Fe ratio of 1 or more in terms of atomic weight ratio.

5. The method according to claim 1, wherein the coating layer is formed in a film shape having a thickness of 30~300 nm.

6. The method according to claim 1, wherein the surface modification comprises immersing the stainless steel sheet in a solution comprising sulfuric acid (H2SO4) and nitric acid (HNO3), or spraying the solution onto the surface of the stainless steel sheet.

7. The method according to claim 6, wherein the surface modification solution further comprises one or more additives selected from hydrogen peroxide (H2O2) and oxalic acid (C2H2O4).

8. The method according to claim 1, wherein the surface modification comprises immersing the stainless steel sheet in a surface modification solution comprising sulfuric acid (H2SO4), and applying a potential (or current) in an SHE region of greater than 0 to 1.0V.

9. The method according to claim 1, wherein the coating layer is formed by sputtering or arc ion plating.

10. The method according to claim 9, wherein the sputtering is reactive sputtering.

11. The method according to claim 1, wherein the stainless steel sheet contains 16~28 wt % chromium.

* * * * *